United States Patent
Merlini et al.

(10) Patent No.: US 8,796,106 B2
(45) Date of Patent: Aug. 5, 2014

(54) ISOLATION TRENCHES

(75) Inventors: Daniele Merlini, Agrate Brianza (IT); Domenico Giusti, Monza (IT); Fabrizio Fausto Renzo Toia, Busto Arsizio (IT); Federica Ronchi, Bellusco (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 573 days.

(21) Appl. No.: 12/749,866

(22) Filed: Mar. 30, 2010

(65) Prior Publication Data

US 2011/0241158 A1    Oct. 6, 2011

(51) Int. Cl.
*H01L 21/76*    (2006.01)
*H01L 21/70*    (2006.01)

(52) U.S. Cl.
USPC ............. 438/424; 257/513; 257/E21.546

(58) Field of Classification Search
None
See application file for complete search history.

(56) References Cited

U.S. PATENT DOCUMENTS

| | | | |
|---|---|---|---|
| 6,064,595 A * | 5/2000 | Logie et al. | 365/185.18 |
| 6,207,535 B1 * | 3/2001 | Lee et al. | 438/435 |
| 6,733,955 B1 * | 5/2004 | Geiger et al. | 430/313 |
| 2004/0192009 A1 * | 9/2004 | Belyansky et al. | 438/424 |
| 2007/0178660 A1 * | 8/2007 | Miller et al. | 438/424 |

* cited by examiner

*Primary Examiner* — Michael Lebentritt
*Assistant Examiner* — Kevin Quinto
(74) *Attorney, Agent, or Firm* — Allen, Dyer, Doppelt, Milbrath & Gilchrist, P.A.

(57) ABSTRACT

A method is for the formation of at least one filled isolation trench having a protective cap in a semiconductor layer, and a semiconductor device with at least one filled isolation trench having a protective cap. The method allows obtaining, in an easy way, filled isolation trenches exhibiting excellent functional and morphological properties. The method therefore allows the obtainment of effective filled isolation trenches which help provide elevated, reliable and stable isolation properties.

33 Claims, 3 Drawing Sheets

ISOLATION TRENCHES

FIELD OF THE INVENTION

The present invention relates to the field of semiconductor technology. In particular, the present invention relates to a method for fabricating an isolation trench in a semiconductor layer, and to a semiconductor device comprising an isolation trench. The present invention also relates to a method for the fabrication of an isolation trench comprising a protective cap, and to a semiconductor device comprising an isolation trench having a protective cap.

BACKGROUND OF THE INVENTION

Isolation trenches are employed in the field of integrated circuits to provide electrical insulation between devices realized, for instance, on a single chip. For example, in the field of silicon on insulator technology (SOI), isolation trenches as deep as the silicon layer are employed in order to define active silicon regions of the device that are effectively insulated from each other.

In particular, when the isolation trenches are so deep so as to contact the insulator layer of the SOI device, the silicon layer is divided into volumes of semiconductor material which are insulated from each other. Each of these volumes defines an active region of the device inside which a plurality of electrical components can be engineered. The presence of isolation trenches helps the achievement of high breakdown voltages, for instance of the order of 100 Volts or more.

The structural and morphological properties of the isolation trenches are important for effective insulation and for avoiding electrical problems such as parasitic capacitances, especially in high voltage devices. In particular, the presence of defects such as impurities, holes, or cracks in an isolation trench can strongly deteriorate the isolation properties of the trench.

The properties of the isolation trenches and, in particular, the number and the nature of the defects in the structure of the trench strongly depend on the process employed for the fabrication of the trench.

Examples of fabrication processes employed for the realization of isolation trenches in a semiconductor layer known in the art are schematically shown in FIGS 1a-1c. The figures schematically display the fabrication of two isolation trenches 110 and 120 in a SOI system. The system comprises a substrate 101, an insulator layer 102 and a silicon layer divided into active regions 103A, 103B and 103C. Moreover, the system is provided with the isolation trenches 110 and 120. The depth of the isolation trenches 110 and 120 correspond to the thickness of the silicon layer so that the trenches 110 and 120 are in contact with the insulation layer 102. In particular, the isolation trench 110 separates the active region 103A of the semiconductor layer from the active region 103B. The isolation trench 120 separates the active region 103B from the active region 103C. The active region 103B is further provided with field oxide regions 131, 132 and 133. The field oxide regions 131, 132 and 133 provide the local insulation for the components engineered in the active region 103B.

The fabrication of the trenches 110 and 120 up to the stage shown in FIG. 1a is typically performed by photolithography, oxidation and deposition techniques. In particular, after realizing the hard mask with a nitride layer 140 on the upper surface of the device, the lateral dimensions and the positions of the trenches are fixed by photolithography. In particular, a resist layer is deposited on the system and it is patterned so as to define the positions and the dimensions of the trenches. Dry etching processes are performed so as to remove the portions of the hard mask in correspondence to the positions of the trenches to be realized. Subsequently, the resist is removed and the semiconductor layer is etched so as to dig the cavities which will house the trenches. In order to fill the cavities with insulating material, a thermal oxidation process is performed so as to cover the side walls of the cavity by a liner oxide. Finally, the cavities are filled by a deposited-oxide. In particular, the cavities are filled by TEOS oxide. This is typically achieved by thermal TEOS-CVD processes wherein Tetraethyl Orthosilicate (TEOS) is employed as a source for silicon dioxide ($SiO_2$) which fills the trenches. In particular, the decomposition of TEOS at elevated temperatures (~700° C.) allows the growth of $SiO_2$ films on the liner oxide formed by thermal oxidation of the side walls of the cavity.

TEOS oxide grows accordingly in the cavity with two growing fronts facing one another and developing from the side walls. Once the two fronts meet, the cavity is filled by insulating material and the process is stopped. The interface formed by the two facing growing fronts of TEOS oxide is a critical region of the trench and it is the source of several structural and morphological problems as described in detail below.

Since TEOS oxide exhibits worse structural and morphological properties than thermal oxide, in particular since the mechanical hardness of TEOS oxide is lower than the mechanical hardness of thermal oxide, the system is annealed in order to increase the hardness of the TEOS oxide.

Finally, chemical mechanical polishing (CMP) is performed in order to remove the excess oxide. In particular, CMP is employed in order to adjust the height of the trench to the height of the other components. As shown in FIG. 1a, the nitride layer 140 is used as stopping layer to achieve the end point of the CMP process.

The oxides left after CMP, especially on the active areas of the device, are typically removed. This is performed by etching processes in the presence of a mask protecting the trenches. In particular, as shown in FIG. 1b, a protection mask comprising the elements 112 and 122 in correspondence with the trenches 110 and 120, respectively, is deposited on the system. Finally, the nitride layer 140 and the residual sacrificial nitrides are removed by wet-etching processes.

These etching processes and, in particular, the etching processes performed by hydrofluoric acid (HF) may damage the isolation trenches and strongly affect their insulation properties. Openings and cracks formed in the trenches as a consequence of the etching processes worsen the structural properties of the trenches and, ultimately, their insulation properties.

One of the most critical regions in this respect is the interface formed in the trench between the TEOS growing fronts. This interface can be easily damaged and re-opened down to several depths. In the worst cases, the interface formed between the TEOS growing fronts can be even opened along the entire depth of the trench creating a sort of deep well.

The openings and cracks formed in the TEOS oxide of the trench and, in particular, the deep well formed at the interface between the growing fronts can contain several kinds of materials which are subsequently deposited on the system. As an example, further deposition of polysilicon, for instance for the purpose of forming electronic components on the active areas of the device, results in the accumulation of this material also in the openings formed in the isolation trenches.

The presence of these electrically floating volumes of polysilicon in the isolation trenches may be harmful for the insulation properties of the trenches.

In general, devices provided with isolation trenches having openings, cracks or areas filled with polysilicon or with other kinds of materials may be unreliable, especially for applications involving high voltages.

Given these drawbacks with the existing technology, it would be advantageous to provide a method which allows the fabrication of reliable isolation trenches. Moreover, it would be advantageous to provide semiconductor devices with isolation trenches having more desirable isolation properties.

SUMMARY OF THE INVENTION

The present invention exploits the fact that a protection cap is provided in the upper region of the trench, with the cap not being subject to the formation of openings and cracks during the etching processes performed after the fabrication of the trench.

According to a first aspect of the invention, a method for the fabrication of at least one filled isolation trench in a semiconductor layers is provided, and includes the step of providing a protective cap into the upper portion of the isolation trench.

According to a second aspect, the invention provides a semiconductor device with a semiconductor layer provided with a filled isolation trench, wherein a protective cap is provided in the upper portion of the isolation trench.

BRIEF DESCRIPTION OF THE DRAWINGS

The accompanying drawings are incorporated into and form a part of the specification to illustrate several embodiments of the present invention. These drawings together with the description serve to explain the principles of the invention. The drawings are only for the purpose of illustrating preferred and alternative examples of how the invention can be made and used and are not to be construed as limiting the invention to only the illustrated and described embodiments. Further features and advantages will become apparent from the following and more particular description of the various embodiments of the invention as illustrated in the accompanying drawings, in which like reference numbers refer to like elements and wherein.

DETAILED DESCRIPTION OF THE PREFERRED EMBODIMENTS

Figure 1A:
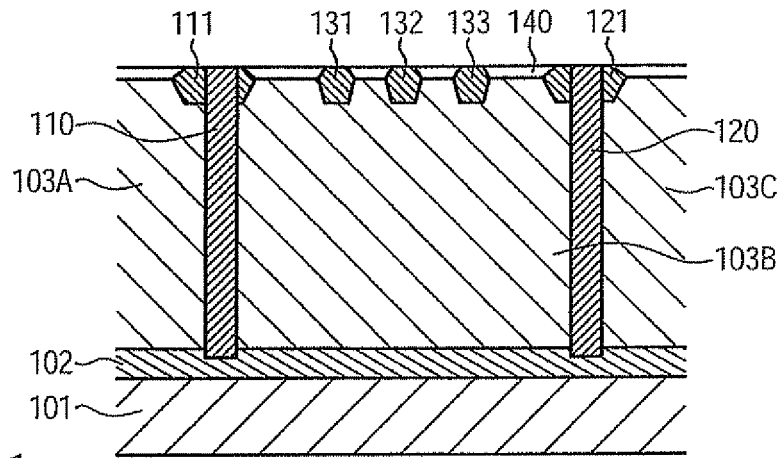
FIGS. 1a-1c schematically show steps of the method for fabricating isolation trenches according to the prior art.
Figure 1B:
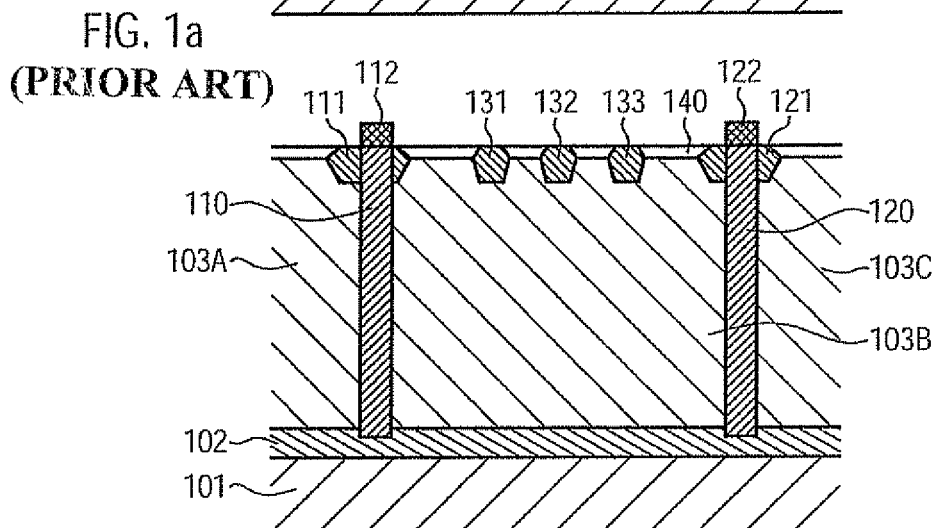
Figure 1C:
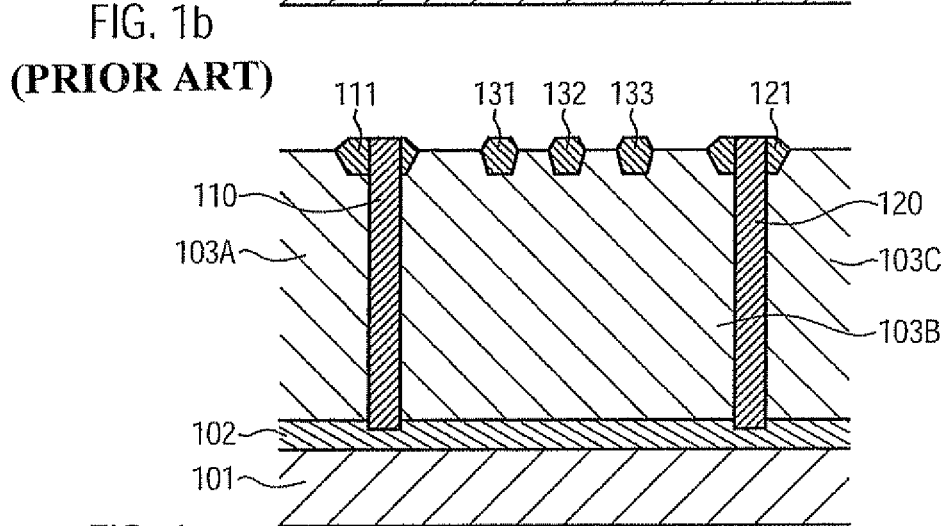

FIGS. 2a-2c and 3a-3c schematically show steps for the fabrication of a pair of insulation trenches 210 and 220 in a semiconductor device according to embodiments of the present invention. The semiconductor device comprises a substrate 201, an insulator layer 202 and a semiconductor layer 203. The substrate 201 can comprise for instance a silicon wafer substrate. The insulator layer 202 can comprise silicon dioxide $SiO_2$. The semiconductor layer 203 can comprise silicon.

The device is provided with a pair of filled isolation trenches 210 and 220. The depth of the isolation trenches 210 and 220 correspond to the thickness of the semiconductor layer 203 so that the trenches 210 and 220 are in contact with the insulation layer 202. In particular, the pair of filled isolation trenches 210 and 220 separate the active region 203A of the semiconductor layer 203 from the active region 203B. An intermediate region 203C of semiconductor material is interposed between the isolation trenches 210 and 220. The intermediate region 203C is grounded. The presence of the pair of isolation trenches 210 and 220 together with the interposed intermediate region 203C helps provide a particularly efficient insulation between the active regions 203A and 203B. This configuration can be employed for instance in the presence of adjacent active components which are preferably effectively insulated. This is, for instance, the case of reduced size devices wherein the active components are close to each other and the insulation can be improved by the presence of pairs of trenches as shown in FIGS. 2a-2c and 3a-3c. Nevertheless, the present invention is not limited to the fabrication of pairs of trenches, but it can be employed also for the fabrication of single trenches.

The device shown in FIGS. 2a-2c and 3a-3c is further provided with field oxide regions 231 and 232. These regions can be employed for instance for the local insulation of the components built on each of the active regions 203A and 203B, respectively, of the semiconductor layer 203.

Furthermore, in the system shown in FIGS. 2a-2c and 3a-3c, the filled trenches 210 and 220 are placed in correspondence of the field oxide region 211. In particular, the upper portions of the trenches 210 and 220 go through the field oxide region 211. This kind of insulation can be employed for instance for devices requiring involving high voltages such as of the order of 200 Volts. Nevertheless, the present invention is not limited to the fabrication of trenches whose upper portion goes through a field oxide region, but it can be employed also for the fabrication of trenches which do not cross field oxide regions.

Figure 2A:
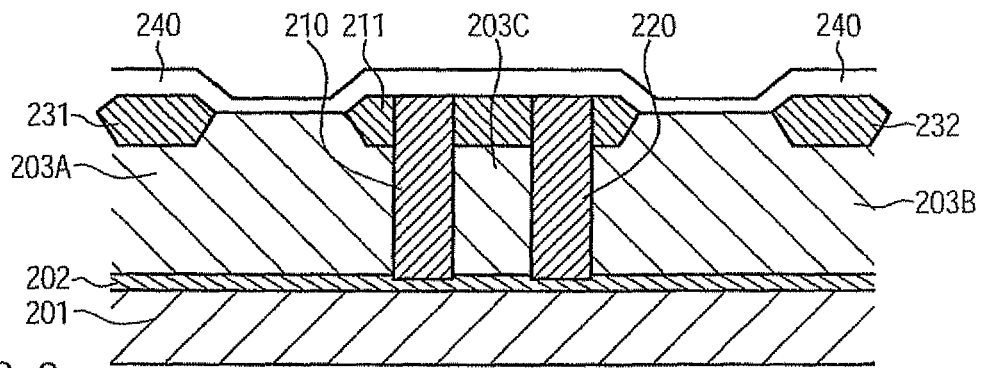
FIGS. 2a-2c schematically show steps of the method for fabricating isolation trenches according to the present invention.

The fabrication of the trenches 210 and 220 up to the stage shown in FIG. 2a can be performed for instance by photolithography, oxidation, and deposition techniques. In particular, a hard mask comprising a nitride layer 240 can be realized on the upper surface of the device. The lateral dimensions and the positions of the trenches can be thus fixed by photolithography. For example, a resist layer can be deposited on the system and it can be patterned so as to define the positions and the dimensions of the trenches. Dry etching processes can be performed so as to remove the portions of the hard mask in correspondence with the positions of the trenches to be realized. Subsequently, the resist can be removed and the semiconductor layer can be etched so as to dig the cavities which will house the trenches.

In order to fill the cavities with insulating material, a thermal oxidation process can be performed so as to cover the side walls of the cavity by a liner oxide. Finally, the cavities can be filled by deposited-oxide. In particular, in the case of silicon devices, the cavities can be filled by TEOS oxide. This can be achieved for instance by thermal TEOS-CVD processes wherein Tetraethyl Orthosilicate (TEOS) is employed as source for silicon dioxide ($SiO_2$) which fills the trenches. The decomposition of TEOS at elevated temperatures (~700° C.) allows the growth of $SiO_2$ films on the liner oxide formed by thermal oxidation of the side walls of the cavity.

A blanket etchback process can be performed in order to planarize the trench. For instance, the blanked etchback process can be performed in order to remove the excess TEOS. The final outcome of the above described processes is schematically shown in FIG. 2a.

Figure 2B:
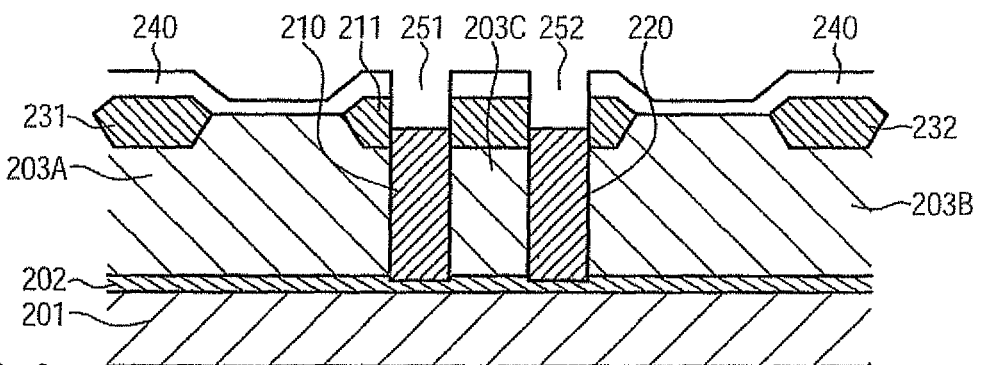

As shown in FIG. 2b, cavities can be dug in the upper portions of the trenches. In particular, FIG. 2b shows that a cavity 251 is dug, etched, or formed through the layer 240 in the upper portion of the trench 210 and a cavity 252 is dug through the layer 240 in the upper portion of the trench 220. In the example shown in FIG. 2b the width of each of the cavities 251 and 252 is equal to the width of the corresponding trench 210 and 220, respectively.

According to alternative embodiments, the cavity can be wider than the trench. In general, the cavity can be dug for instance not only in the upper portion of the trench with a width equal to the width of the trench, but also in portions of material at one or both sides of the upper portion of the trench. For example, in case the upper portion of the trench goes through a field oxide region whose lateral extension is higher than the width of the trench, the cavity can be dug not only in the upper portion of the trench, but also in portions of the field oxide region so that the width of the cavity is greater than the width of the trench.

The depth of the cavity can assume several values. For instance, in case the upper portion of the trench goes through a field oxide region as shown in FIGS. 2a-2c and 3a-3c, wherein the upper portions of the trenches 210 and 220 go through the field oxide region 211, the cavity can be dug so that its bottom surface is approximately at a level corresponding to half the thickness of the field oxide region. According to further embodiments of the invention, the cavity can be dug so that its bottom surface is at a level below the level corresponding to half thickness of the field oxide region. According to further embodiments of the invention, the cavity can also be dug so that its bottom surface is approximately at a level corresponding to the bottom surface of the field oxide region.

The cavity can be dug, for instance, by etching processes controlled by end point and by a subsequent dedicated overetch. In order to control the outcome of the etching processes and the morphology of the cavity dug it is possible to perform AFM (Atomic Force Microscope) measurements.

Figure 2C:
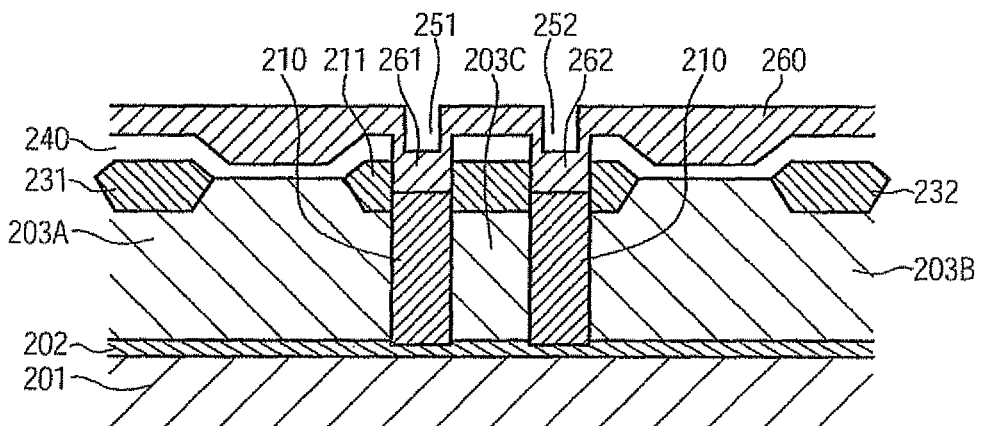

As shown in FIG. 2c, the cavities 251 and 252 are subsequently filled. In particular, in the embodiment shown in FIG. 2c, the layer of material 260 is deposited on the system so as to fill the cavities 251 and 252. The amount of material 260 deposited depends on the depth of the cavities 251 and 252. Moreover, the cavities 251 and 252 can be partially filled, completely filled or filled in excess. In particular, if the cavities 251 and 252 are partially filled, the upper surface of the deposited material 260 is at a lower level than the level of the upper surface of the trench prior to the digging of the cavity. If the cavities 251 and 252 are completely filled, the upper surface of the deposited material 260 is at the same level as the surface of the trench prior to the dig of the cavity. If the cavities 251 and 252 are filled in excess, the upper surface of the deposited material 260 is at a higher level with respect to the original level of the upper surface of the trench prior to the digging of the cavity. In the embodiment shown in FIG. 2c, the cavities 251 and 252 are filled in excess so as to partially fill also the space in correspondence to the hard mask layer 240.

The process employed for the deposition of the layer of material 260 can be a process which inhibits the formation of interfaces in the final structure of the grown material. For example, the material 260 can be a material grown by High Density Plasma Chemical Vapor Deposition (HDP-CVD), such as an HDP-oxide, i.e. an oxide deposited by HDP-CVD. Because of the presence of the high density plasma, HDP-CVD processes allow the growth of materials on a surface from the bottom toward the top with respect to the surface itself. In other words, HDP-CVD processes inhibit the growth on side surfaces. Accordingly, when filling, for example, a cavity by HDP processes, the cavity is directly filled by material growing from the bottom to the top of the cavity and not by material growing from the side walls of the cavity. The material grown in the cavity by HDP processes does not display, therefore, interfaces in its final structure. On the contrary, for example, when filling a cavity by TEOS-CVD, the material grows from the side walls of the cavity according to two facing growing fronts. The cavity is filled when the two growing fronts meet. Accordingly, the material grown in the cavity by TEOS-CVD exhibits in its final structure interfaces in correspondence to the regions where the facing growing fronts meet.

Materials employed for the formation of the layer 260 can be oxides, dielectric materials and the like. In general, materials employed for the formation of the layer 260 can be insulating materials. An example of the material employed for the formation of the layer 260 in case of silicon technology is a silicon oxide grown by HDP-CVD.

After the formation of the layer 260, the system can be annealed. For example, in the case of silicon technology, since TEOS oxide filling the trench exhibits worse structural and morphological properties than thermal oxide grown as the liner oxide at the side walls of the trench. In particular since the mechanical hardness of TEOS oxide is lower than the mechanical hardness of thermal oxide, the system can be annealed (for example to temperatures above 1000° C.) in order to increase the hardness of the TEOS oxide. This annealing further allows the material 260 to harden. For example, if the material 260 filling the cavities 251 and 252 dug in the upper portions of the trenches 210 and 220, respectively, comprises a HDP-oxide, the annealing allows it to harden inside the cavities.

Figure 3A:
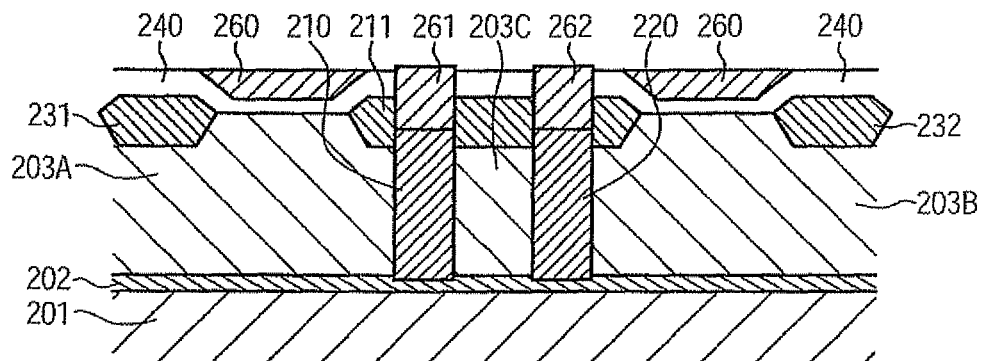
FIGS. 3a-3c schematically show steps of the method for fabricating isolation trenches according to the present invention.

After the annealing, a chemical mechanical polishing (CMP) process can be performed in order to remove the excess oxide as shown in FIG. 3a. In particular, CMP can be employed in order to adjust the height of the material 260 filling the cavities 251 and 252. As shown in FIG. 3a, the nitride layer 240 can be used as stopping layer to achieve the end point of the CMP process.

Figure 3B:
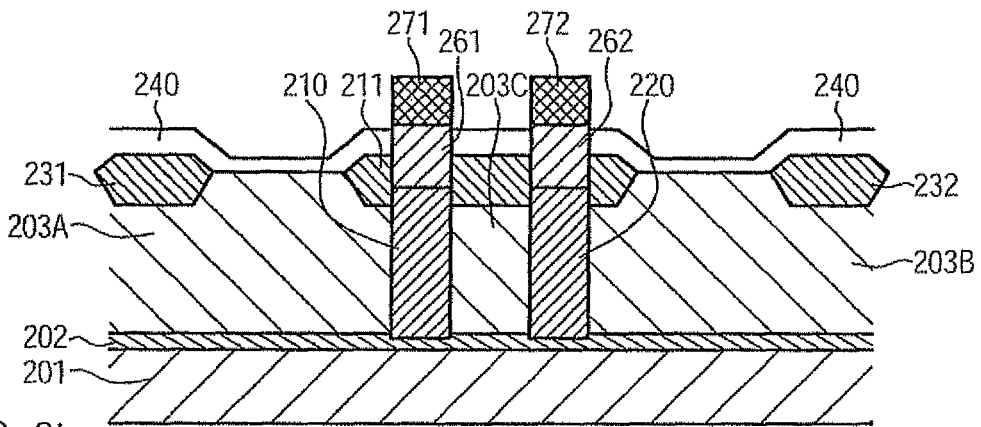

FIG. 3a displays that portions of material 260 are left on the active areas 203A and 203B. In order to remove these residual portions of material 260 and, in general, in order to remove any residue left after CMP especially on the active areas of the device, etching processes in the presence of a mask can be performed as shown in FIG. 3b. FIG. 3b displays a protection mask comprising the elements 271 and 272 in correspondence to the trenches 210 and 220, respectively, deposited on the system. The elements 271 and 272 of the mask cover the portions of material 260 filling the cavities 251 and 252 dug in the upper portions of the trenches 210 and 220. Accordingly, the etching process employed for removing the residual portions of material 260 do not affect the material filling the cavities 251 and 252. Finally, the nitride layer 240 and the residual sacrificial nitrides can be removed for example by wet-etching processes.

Figure 3C:
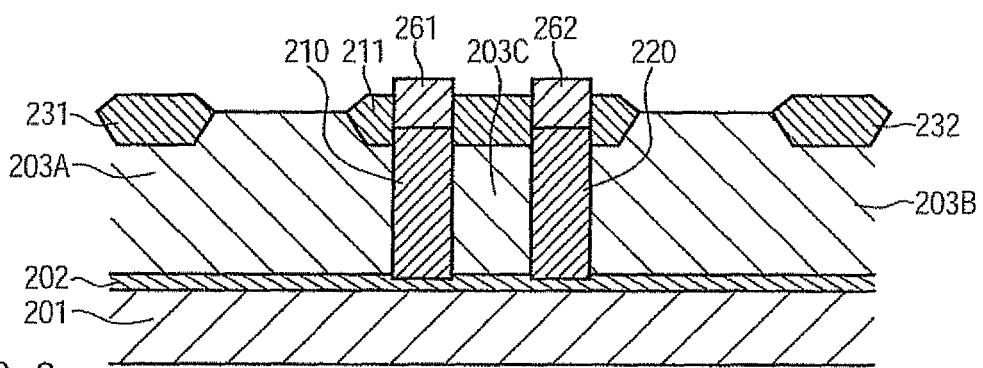

As shown in FIG. 3c, the semiconductor device comprises the pair of isolation trenches 210 and 220 having protection caps 261 and 262, respectively. Because of the presence of the protection caps 261 and 262 in the cavities 251 and 252, the processes employed for removing the nitride layer 240 of the hard mask and, in general, the further processes performed on the device, may not affect the morphological and structural properties of the isolation trenches. In particular, the formation of defects such as openings, holes, cracks or the like in the isolation trenches is inhibited by the presence of the protection caps 261 and 262. Furthermore, the infiltration of materials into the trenches is inhibited as well.

The method according to the present invention provides, therefore, for the formation of effective isolation trenches which provide elevated, reliable and stable isolation properties. The method for fabricating isolation trenches according to the present invention can be employed for several kinds of devices. For example, the method according to the present invention can be employed for devices of the technology node 35 nm.

It is clear for the person skilled in the art that it is possible to realize several modifications, variations and improvements of the present invention in the light of the teaching described above and within the ambit of the appended claims without departing from the object and the scope of protection of the invention.

For example, it is possible to fabricate isolation trenches according to the method of the present invention not only for semiconductor-on-insulator devices but for any kind of semiconductor devices requiring the presence of isolation trenches. For instance, the method may be employed for several kinds of semiconductor layers. For example, it is possible to employ the method for the fabrication of isolation trenches into bulk substrates or into epitaxial substrates of semiconductor material. Moreover, it is possible to employ the method both for realizing thin isolation trenches (shallow trench insulation) and for realizing deep isolation trenches (deep trench insulation).

Moreover, the method can be employed for the fabrication of any number of trenches in a semiconductor layer. In particular, the method is not limited to the fabrication of pairs of isolation trenches but can also be employed for the fabrication of single isolation trenches. Furthermore, the method can be employed for the fabrication of any number of adjacent isolation trenches.

Furthermore, the present invention can be employed for trenches filled with several kinds of materials. For example, it can be employed for trenches filled with TEOS oxide or for trenches filled with thermal oxide.

In addition, those areas in which it is believed that those of ordinary skill in the art are familiar, have not been described herein in order not to unnecessarily obscure the invention described. Accordingly, it has to be understood that the invention is not to be limited by the specific illustrative embodiments, but only by the scope of the appended claims.

That which is claimed is:

1. A method of making a semiconductor device comprising:
   forming a filled isolation trench in a semiconductor layer comprising forming a first cavity in the semiconductor layer, and filling the first cavity with insulating material;
   forming a filled additional isolation trench in the semiconductor layer adjacent the filled isolation trench and separated therefrom by a portion of semiconductor material to be coupled to a reference voltage, the forming comprising forming a first additional cavity in the semiconductor layer, and filling the first additional cavity with insulating material;
   forming a second cavity in an upper portion of the filled isolation trench, and depositing a material in the second cavity to form a protective cap over the filled isolation trench;
   forming a second additional cavity in an upper portion of the filled additional isolation trench, and depositing a material in the second additional cavity to form a protective cap over the filled additional isolation trench; and
   forming protection masks over the protective caps formed in the filled isolation trench and in the filled additional isolation trench, and etching the semiconductor layer.

2. The method according to claim 1, wherein the protective cap comprises an oxide.

3. The method according to claim 1, wherein the protective cap is formed via Chemical Vapor Deposition (CVD).

4. The method according to claim 3, wherein the Chemical Vapor Deposition comprises a High Density Plasma (HDP) deposition.

5. The method according to claim 1, wherein the semiconductor layer comprises silicon.

6. The method according to claim 1, wherein a width of the second cavity is at least equal to a width of the filled isolation trench.

7. The method according to claim 1, wherein a depth of the second cavity is at least equal to a width of the second cavity.

8. The method according to claim 1, wherein the material is deposited in the second cavity by High Density Plasma (HDP) deposition.

9. The method according to claim 1, wherein the first cavity is formed through a field oxide region.

10. The method according to claim 1, wherein filling the first cavity with insulating material comprises performing a thermal oxidation of side walls of the cavity.

11. The method according to claim 1, wherein the first cavity is filled via Chemical Vapor Deposition (CVD).

12. The method according to claim 11, wherein the CVD comprises Chemical Vapor Deposition of Tetraethyl Orthosilicate.

13. The method according to claim 1, further comprising annealing the semiconductor layer so as to harden the insulating material.

14. The method according to claim 1, further comprising performing a blanket etchback on the semiconductor layer prior to forming the second cavity in the upper portion of the filled isolation trench so as to planarize the filled isolation trench.

15. The method according to claim 1, wherein the material is deposited in the second cavity by High Density Plasma (HDP) deposition.

16. The method according to claim 1, further comprising annealing the semiconductor layer so as to harden the insulating material and the material deposited in the second cavity formed in the upper portion of the filled isolation trench.

17. The method according to claim 1, further comprising performing a chemical mechanical polishing of the semiconductor layer so as to planarize the material deposited in the second cavity formed in the upper portion of the filled isolation trench.

18. The method according to claim 1, further comprising removing the protection mask and further etching the semiconductor layer to remove sacrificial nitrides.

19. The method according to claim 1, wherein the filled isolation trench is one of a shallow filled isolation trench and a deep filled isolation trench.

20. The method according to claim 1, wherein the semiconductor layer is an upper layer of a semiconductor-on-insulator system and a depth of the filled isolation trench is equal to a thickness of the semiconductor layer so that the filled isolation trench is in contact with an isolation layer of the semiconductor-on-insulator system.

21. A method of making a semiconductor device comprising:
   forming a filled isolation trench in a semiconductor layer;
   forming a cavity in an upper portion of the filled isolation trench;

forming a protective cap over the upper portion of the filled isolation trench via High Density Plasma deposition to thereby inhibit formation of interfaces in the protective cap;

forming an additional filled isolation trench adjacent the filled isolation trench and separated therefrom by a portion of semiconductor material to be coupled to a reference voltage; and forming an additional protective cap over the additional filled isolation trench.

22. The method according to claim 21, wherein a width of the cavity is at least equal to a width of the filled isolation trench.

23. The method according to claim 21, wherein a depth of the cavity is at least equal to a width of the cavity.

24. The method according to claim 21, wherein material is deposited in the cavity by High Density Plasma (HDP) deposition.

25. The method according to claim 21, wherein the semiconductor layer comprises silicon.

26. A semiconductor device comprising:
a semiconductor layer and a filled isolation trench therein;
a protective cap on an upper portion of said filled isolation trench and being devoid of interfaces;
an additional filled isolation trench adjacent the filled isolation trench and separated therefrom by a portion of semiconductor material to be coupled to a reference voltage; and
an additional protective cap over the additional filled isolation trench.

27. The semiconductor device according to claim 26, wherein said protective cap comprises an oxide layer.

28. The semiconductor device according to claim 26, wherein said protective cap comprises a Chemical Vapor Deposition (CVD) oxide layer.

29. The semiconductor device according to claim 26, wherein said semiconductor layer comprises silicon.

30. The semiconductor device according to claim 26, wherein said protective cap has a width at least equal to a width of the filled isolation trench.

31. The semiconductor device according to claim 26, wherein the semiconductor layer has a field oxide region therein; and wherein the filled isolation trench goes through the field oxide region.

32. The semiconductor device according to claim 26, wherein said filled isolation trench is a shallow filled isolation trench.

33. The semiconductor device according to claim 26, wherein said filled isolation trench is a deep filled isolation trench.

* * * * *